(12) United States Patent  
St. Germain et al.

(10) Patent No.: US 7,397,120 B2
(45) Date of Patent: Jul. 8, 2008

(54) SEMICONDUCTOR PACKAGE STRUCTURE FOR VERTICAL MOUNT AND METHOD

(75) Inventors: Stephen St. Germain, Scottsdale, AZ (US); Francis J. Carney, Queen Creek, AZ (US); Bruce Alan Huling, Buckeye, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 77 days.

(21) Appl. No.: 11/311,824

(22) Filed: Dec. 20, 2005

(65) Prior Publication Data

US 2007/0138503 A1   Jun. 21, 2007

(51) Int. Cl.
*H01L 23/538* (2006.01)

(52) U.S. Cl. .......................... 257/727; 257/177; 257/686; 257/777; 257/E23.178

(58) Field of Classification Search .................. 257/686, 257/727, 777, 177, E23.178
See application file for complete search history.

(56) References Cited

U.S. PATENT DOCUMENTS

| 6,710,996 | B2* | 3/2004 | Bobert et al. ............... 361/124 |
| 7,053,474 | B2* | 5/2006 | Otremba ..................... 257/685 |
| 2002/0146860 | A1* | 10/2002 | Kinsman ..................... 438/107 |
| 2007/0075406 | A1* | 4/2007 | Ho et al. ..................... 257/666 |
| 2007/0090463 | A1* | 4/2007 | Xiaochun ..................... 257/369 |
| 2007/0200250 | A1* | 8/2007 | Koenigsberger et al. .... 257/778 |

* cited by examiner

*Primary Examiner*—Evan Pert
*Assistant Examiner*—Victor A. Mandala, Jr.
(74) *Attorney, Agent, or Firm*—Kevin B. Jackson

(57) ABSTRACT

In one embodiment, a semiconductor package structure includes a plurality of upright clips having ends with mounting surfaces for vertically mounting the package to a next level of assembly. A semiconductor chip is interposed between the upright clips together with one or more spacers.

18 Claims, 8 Drawing Sheets

SEMICONDUCTOR PACKAGE STRUCTURE FOR VERTICAL MOUNT AND METHOD

FIELD OF THE INVENTION

This invention relates generally to electronic devices, and more specifically to semiconductor packages and methods of assembly.

BACKGROUND OF THE INVENTION

The packaging of semiconductor components such as power semiconductor devices involves a number of design challenges. Such challenges include cost, heat dissipation, device protection, size, performance, and reliability among others. Examples of prior art power packages that have been developed and improved upon to address such issues include the TO-220, TO-218, CASE 77, TO-247, Dpak, $D^2$pak, $D^3$pak, quad flat pack no-lead (QFN), quad flat pack (QFP), small outline (SOP) packages among others.

In a typical power semiconductor package, a semiconductor chip or device is attached to a conductive lead frame having an attach paddle and conductive leads. Input/output pads on the semiconductor chip are then coupled to the leads using conductive wires. The semiconductor chip and portions of the metal lead frame are then encapsulated with an epoxy mold compound, which functions to protect the device. Portions of the conductive leads are left exposed or unencapsulated so that the packaged device may be attached to a next level of assembly such as a printed circuit board. In the prior art packages listed above, the major or main current carrying surfaces of the semiconductor device are parallel to the next level of assembly when attached thereto.

Although advances have been made in semiconductor packaging, the electronics industry still demands smaller, more cost effective, and more reliable packaged semiconductor devices. This includes packaged devices that have enhanced thermal performance, and that are adaptable to various electrical configurations.

Accordingly, a need exists for a package structure and method of manufacture that addresses these demands as well as others.

DETAILED DESCRIPTION OF THE DRAWINGS

Figure 1:
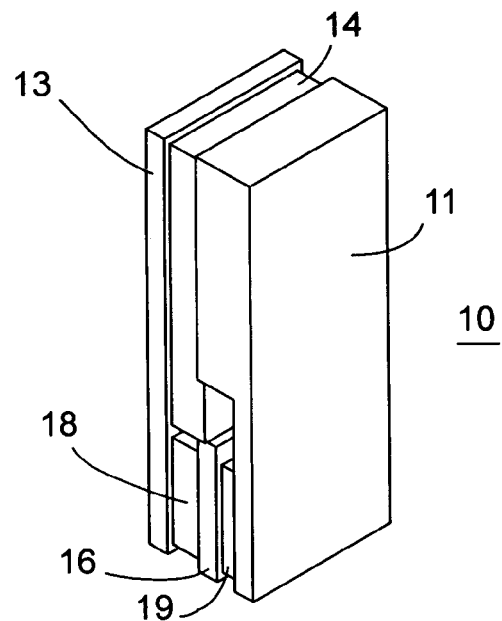
FIG. 1 illustrates an isometric view of a semiconductor package structure in accordance with the present invention.

For ease of understanding, elements in the drawing figures are not necessarily drawn to scale, and like element numbers are used where appropriate throughout the various figures to denote the same or similar elements. Although the present invention is described below in a power transistor configuration having three electrodes, those skilled in the art understand that the present invention is applicable to other semiconductor devices as well.

FIG. 1 shows an isometric view of a semiconductor package structure for vertical mount, a vertical mount power semiconductor package, a vertical mount semiconductor device, or power packaged device for upright mounting 10 in accordance with an embodiment of the present invention. In this embodiment, package structure 10 comprises a power transistor device, and includes first and second upright or upset clips, portions, or elements 11 and 13. Upright clips 11 and 13 comprise a conductive material, and provide support, protection, and current carrying electrodes for a semiconductor chip or device 14 interposed there between. By way of example, upright clip 11 provides a source or emitter contact or electrode for package structure 10, and upright clip 13 provides a drain or collector contact or electrode for package structure 10.

Package structure 10 further includes a third upright or upset clip, portion or element 16 that is interposed between upright clips 11 and 13 in this embodiment. Upright clip 16 functions as a control electrode, and is coupled to semiconductor device 14. For example, upright clip 16 functions as a gate or base contact or electrode for package structure 10. By way of example, upright clips 11, 13 and 16 comprise stamped or etched copper, a copper alloy, a copper plated iron/nickel alloy (e.g., copper plated Alloy 42), plated aluminum, plated plastic, or the like. Plated materials include copper, silver, or multi-layer plating such nickel-palladium and gold. In one embodiment and as shown in FIG. 1, upright clips 11 and 13 are slightly larger than semiconductor device 14 for added protection.

Spacers, partitions, or division members 18 and 19 are placed between upright clips 11, 13 and 16 as shown in FIG. 1. Spacers 18 and 19 may have the same shape, different shapes, the same thicknesses, or different thicknesses depending on the dimensional requirements or tolerances of package structure 10. Additionally, spacers 18 and 19 may comprise either an insulative or conductive material depending on the desired electrical characteristics of package structure 10. For example, spacer 18 may be insulative and spacer 19 may be conductive to provide a source tied to gate configuration. Alternatively, spacer 18 may be conductive and spacer 19 may be insulative to provide a drain tied to gate configuration. This provides improved design flexibility in accordance with the present invention.

When insulative, spacers 18 and/or 19 comprise, for example a ceramic, plastic, or a metal coated with an insulative material. In one embodiment, spacers 18 and 19 comprise a conductive material, but are attached to upright clips 11, 13, and 16 using an insulative material such as a non-conductive epoxy. When conductive spacers 18 and/or 19 are conductive, they comprise, for example, a material described above for upright clips 11, 13 and 16.

Figure 2:
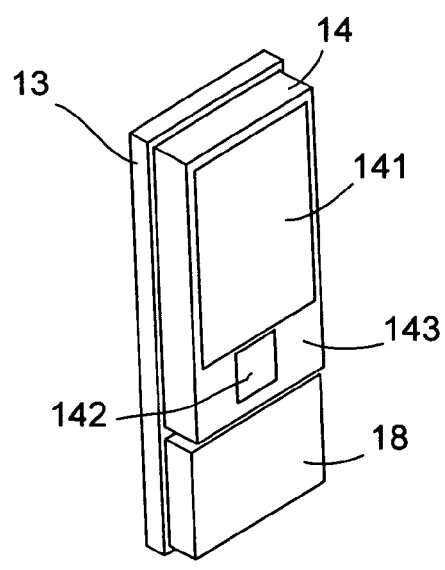
FIG. 2 illustrates an isometric view of a portion of the semiconductor package of FIG. 1 at an earlier step in assembly.

FIG. 2 shows an isometric view of a portion of package structure 10 at an earlier step in assembly. Specifically, semiconductor device 14 is shown with a first current carrying electrode 141 (e.g., source or emitter) and a control electrode 142 (e.g., gate or base) formed on or overlying a major surface 143 of semiconductor device 14. The major surface of semiconductor device 14 opposite that of major surface 143 is attached to upright clip 13 using a die attach layer or material such as conductive epoxy or a solder. Spacer 18 is attached to another portion of upright clip 13 using an epoxy (conductive or insulative depending on the application) or a solder.

Figure 3:
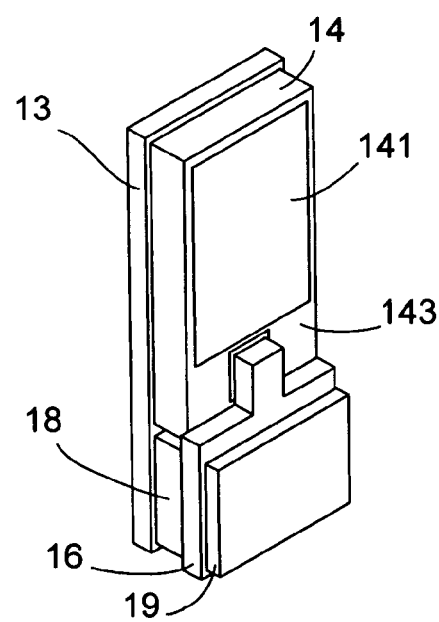
FIG. 3 illustrates an isometric view of a further portion of the semiconductor package of FIG. 1 after further assembly.

FIG. 3 shows an isometric view of package structure 10 after upright clip 16 is attached to control electrode 142 of semiconductor device and spacer 18. In one embodiment, upright clip 16 includes a struck-up portion or member 162 for contacting control electrode 142 in a localized manner. By way of example, upright clip 16 is attached to control electrode 142 using a conductive epoxy or a solder, and is attached to spacer 18 using an epoxy (insulative or conductive) or a solder. Spacer 19 is then attached to upright clip 16 using an epoxy (insulative or conductive) or a solder depending on the device application. Next upright clip 11 is attached to current carrying electrode 141 of semiconductor device 14 using a conductive epoxy or a solder, and is attached to spacer 19 using an epoxy (insulative or conductive) or a solder to provide packaged structure 10 shown in FIG. 1.

Figure 4:
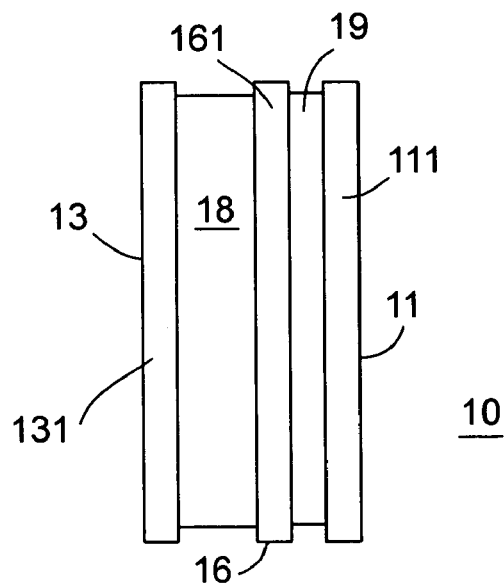
FIG. 4 illustrates a bottom end view of the semiconductor package structure of FIG. 1.

Turning now to FIG. 4, a bottom end view of packaged structure 10 is shown. In this view, mounting ends or surfaces 111, 131, and 161 of upright clips 11, 13, and 16 respectively are shown with spacers 18 and 19 interposed there between. Mounting ends 111, 131, and 161 provide major end surfaces for mounting package structure 10 in a vertical or upright fashion to a next level of assembly in accordance with the present invention. Mounting ends 111, 131 and 161 have surface areas sufficient to attach to a next level assembly. In one embodiment, mounting ends 111, 131, and 161 have substantially flat surfaces.

Figure 5:
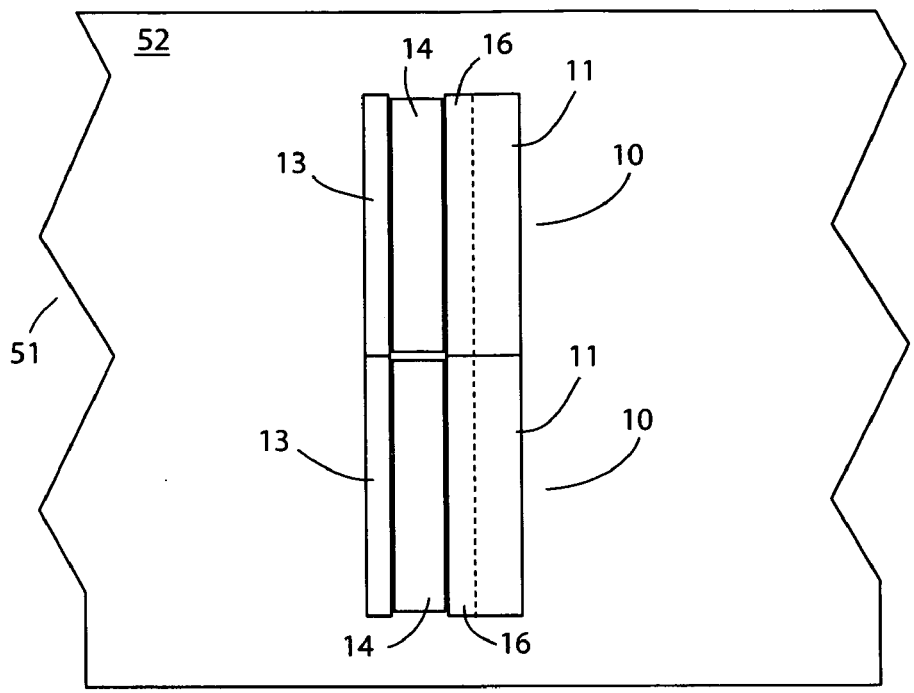
FIG. 5 illustrates a top end view of a plurality of semiconductor package structures of FIG. 4 in accordance with an embodiment of the present invention.

FIG. 5 shows a top view of an assembly 51, which includes a plurality of package structures 10 mounted in a side by side fashion to a next level of assembly 52 (e.g., a printed circuit board). By mounting packaged structures 10 vertically, the present invention saves on horizontal board space, which allows for more components to be integrated onto the board or allows for one that is smaller. In this embodiment, packaged structures 10 are shown with adjacent upright portions 11 and adjacent upright portions 13 tied, connected, or coupled together as an example to further show the design flexibility of the present invention.

When semiconductor device 14 comprises a power MOSFET device, assembly 51 comprises a plurality of packaged power MOSFETS in a side by side source to source and drain to drain configuration. Upright clips 16 are shown in phantom in FIG. 5 since they are below upright clips 11 in this configuration, and upright clips 16 may be tied, connected, or coupled together as well in this configuration.

Plurality of package structures 10 are connected together using for example, an epoxy or a solder. In alternative embodiments, combinations of insulative and conductive epoxies or solders are used to selectively connect and/or isolate adjacent upright clips.

Figure 6:
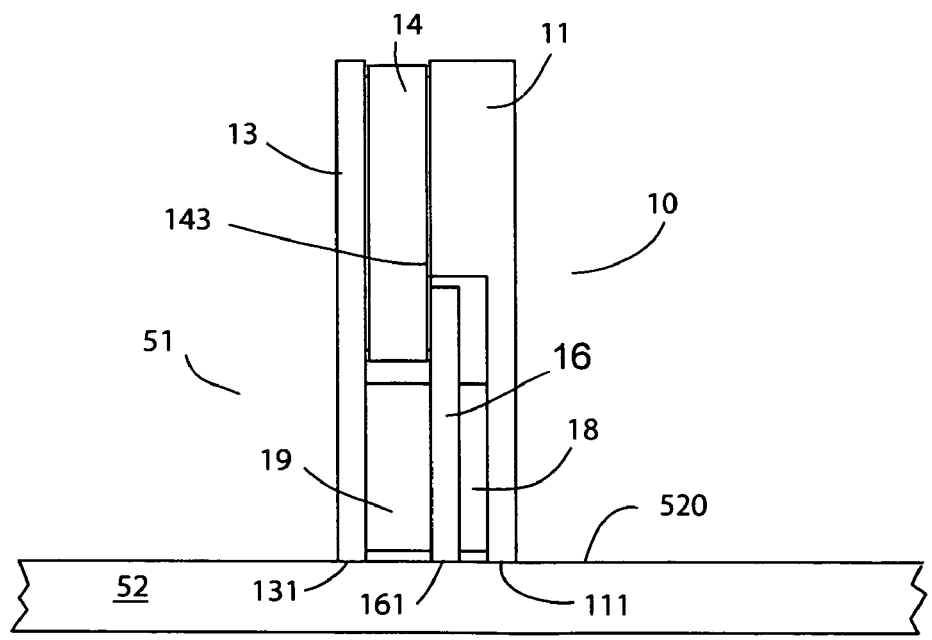
FIG. 6 illustrates a side view of the semiconductor package structure of FIG. 5.

FIG. 6 shows a side view of assembly 51 with a package structure 10 mounted in a vertical or upright manner to printed circuit board 52. In accordance with the present invention, major surface 143 of semiconductor device 14 is perpendicular or vertical with respect to major surface 520 of printed circuit board 52. This feature serves to enhance thermal dissipation by, for example, convective cooling and further saves on horizontal space.

Figure 7:
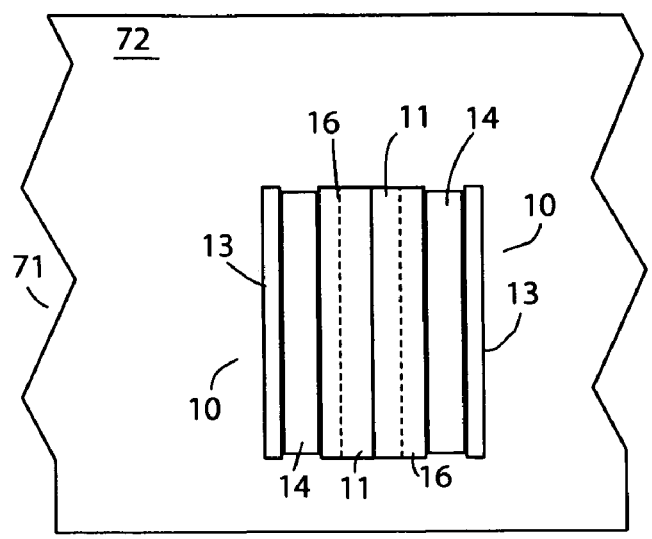
FIG. 7 illustrates a top end view of a plurality of semiconductor package structures of FIG. 4 in accordance with another embodiment of the present invention.

FIG. 7 shows a top view of an assembly 71 with a plurality of package structures 10 mounted vertically or upright on a next level of assembly (e.g., a printed circuit board) 72 in accordance with another embodiment of the present invention. In this embodiment, plurality of packaged structures 10 is in a back to back or source to source configuration. In other words, two similar current carrying electrodes are tied, connected or coupled together in this embodiment.

Figure 8:
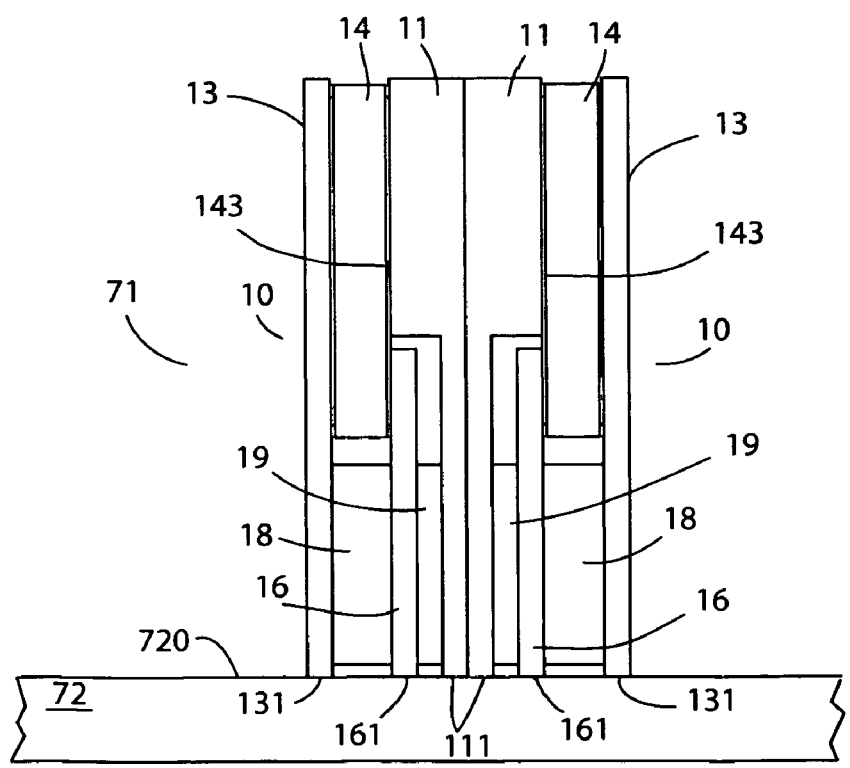
FIG. 8 illustrates a side view of the semiconductor package structure of FIG. 7.

FIG. 8 shows a side view of assembly 71 with package structures 10 mounted in a vertical or upright manner to printed circuit board 72. In accordance with the present invention, major surfaces 143 of semiconductor devices 14 are perpendicular or vertical with respect to major surface 720 of printed circuit board 72.

Figure 9:
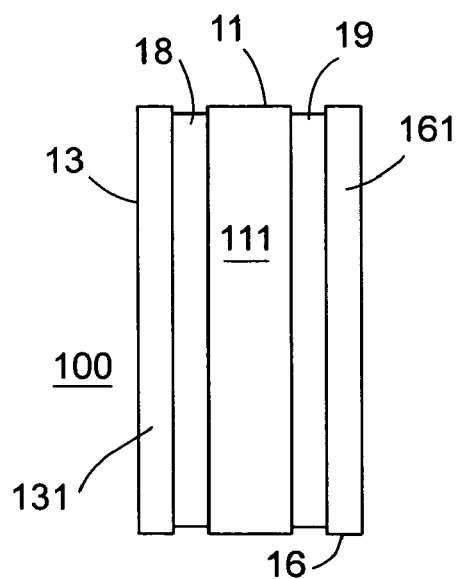
FIG. 9 illustrates a bottom end view of a semiconductor package structure in accordance with a further embodiment of the present invention.

Turning now to FIGS. 9-13, alternative embodiments of the present invention are described. FIG. 9 shows a bottom end view of a semiconductor package structure for vertical mount, a vertical mount power package, a vertical mount semiconductor device, or power packaged device for upright mounting 100 in accordance with another embodiment of the present invention. In this embodiment, upright clip 11 is interposed between upright clips 13 and 16. In this embodiment, mounting ends 131, 111, and 161 of upright clips 13, 11, and 16 respectively are shown. Mounting ends 131, 111, and 161 provide major end surfaces for mounting packaged structure 100 in a vertical or upright fashion to a next level of assembly in accordance with the present invention.

Figure 10:
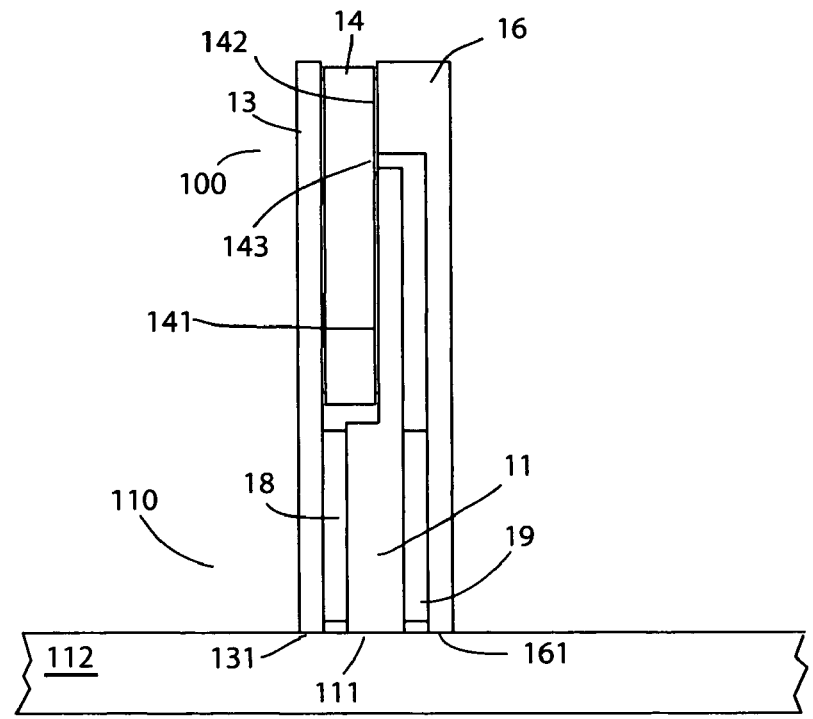
FIG. 10 illustrates a side view of the semiconductor package structure of FIG. 9.

FIG. 10 shows a side view of an assembly 111 including a package structure 100 vertically mounted to a next level of assembly (e.g., a printed circuit board) 112. FIG. 10 further shows package structure 100 including a semiconductor device 14, which in this embodiment is rotated 180 degrees compared to semiconductor device 14 shown in FIG. 2 so that upright clip 11 is attached to electrode 141 of semiconductor device 14 towards the center portion of the package, and upright clip 16 is attached to electrode 142 of semiconductor device 14 above upright clip 11.

Figure 11:
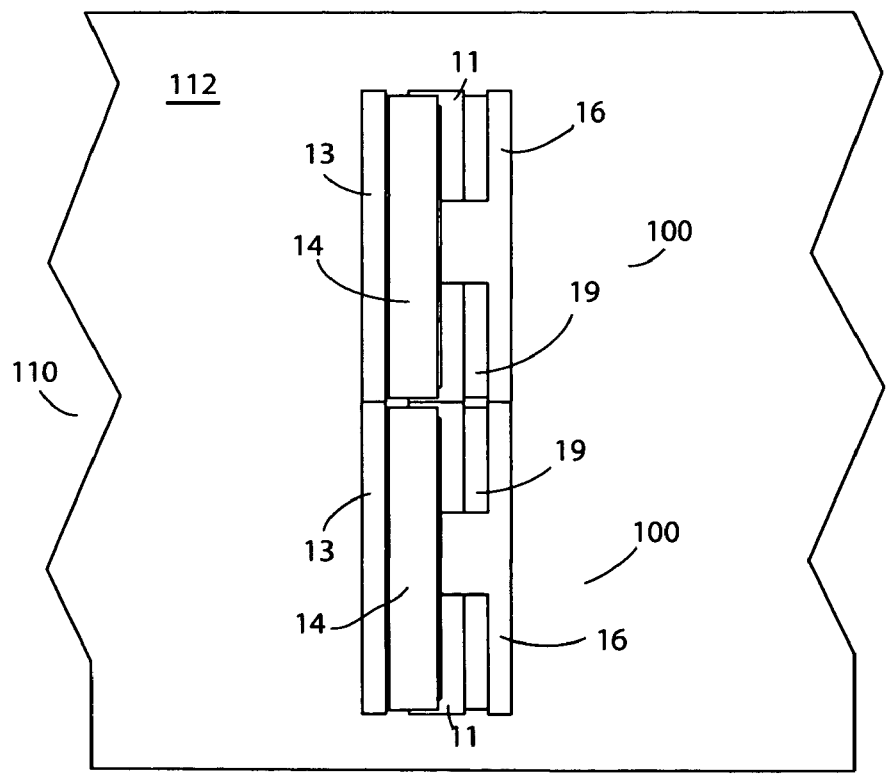
FIG. 11 illustrates a top end view of a plurality of semiconductor package structures of FIG. 10 in accordance with a still further embodiment of the present invention.

FIG. 11 shows a top view of assembly 111 including a plurality of package structures 100 vertically mounted to printed circuit board 112. In this embodiment, plurality of packaged structures 100 are vertically mounted in a side by side fashion so that adjacent upright clips 13, 11, and 16 of packaged structures 100 are tied, connected, or coupled together to further illustrate the design flexibility of the present invention.

Figure 12:
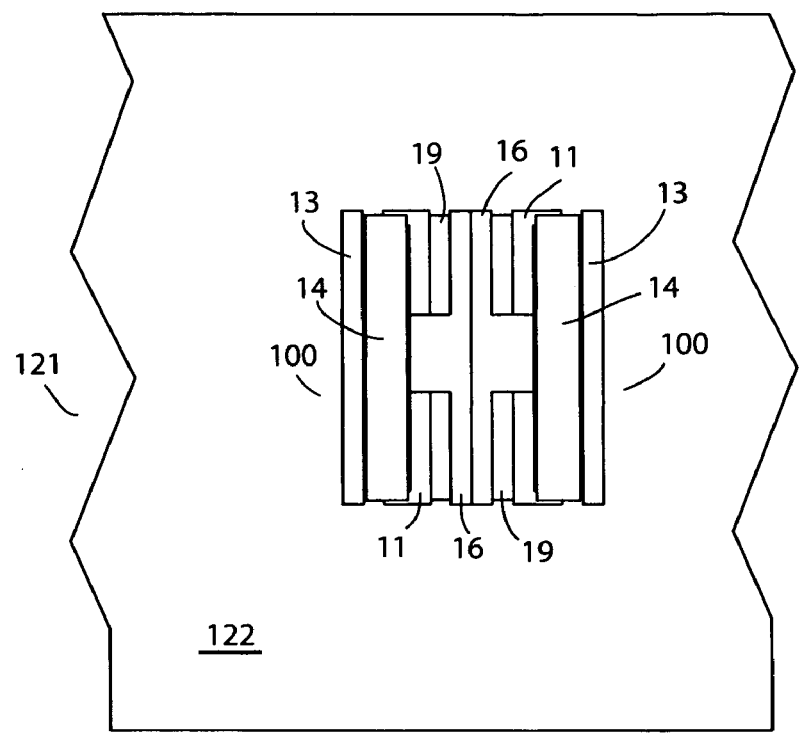
FIG. 12 illustrates a top end view of a plurality of semiconductor packages structures of FIG. 10 in accordance with an additional embodiment of the present invention.

FIG. 12 shows a top view of assembly 121 including a plurality of package structures 100 vertically mounted to printed circuit board 122. In this embodiment, plurality of package structures 100 are vertically mounted in a back to back fashion so that adjacent upright clips 16 of packaged structures 100 are tied, connected, or coupled together. In one embodiment, adjacent upright clips 16 are connected with an epoxy or solder layer.

Figure 13:
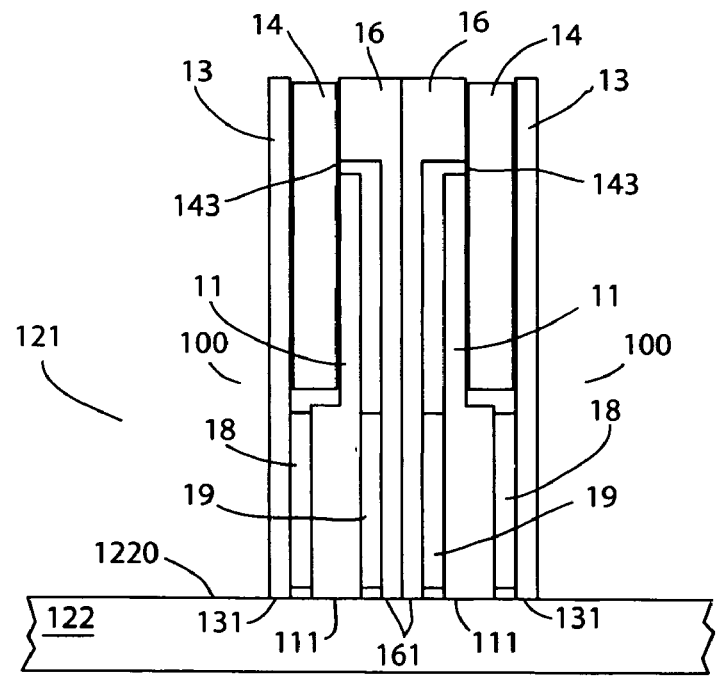
FIG. 13 illustrates a side view of the semiconductor package structure of FIG. 12.

FIG. 13 shows a side view of assembly 121 with package structures 100 mounted in a vertical or upright manner to printed circuit board 122. In accordance with the present invention, major surfaces 143 of semiconductor devices 14 are perpendicular or vertical with respect to major surface 1220 of printed circuit board 122. This feature serves to enhance thermal dissipation and further saves on horizontal space.

FIGS. 14-18 show the semiconductor package structures of FIGS. 9-13 in further embodiments with the addition of a protective or encapsulation layer 81 formed around portions of the package structures. By way of example, encapsulation layer 81 comprises an epoxy mold compound and is formed using conventional molding techniques. In one embodiment, the semiconductor package structures (e.g., those structures shown in FIGS. 1, and 4-13) of the present invention are formed and/or attached together as described above, and then the structures are placed into a molding apparatus to form encapsulating layer 81. In one embodiment, the encapsulated structure is then attached to a next level of assembly.

Figure 14:
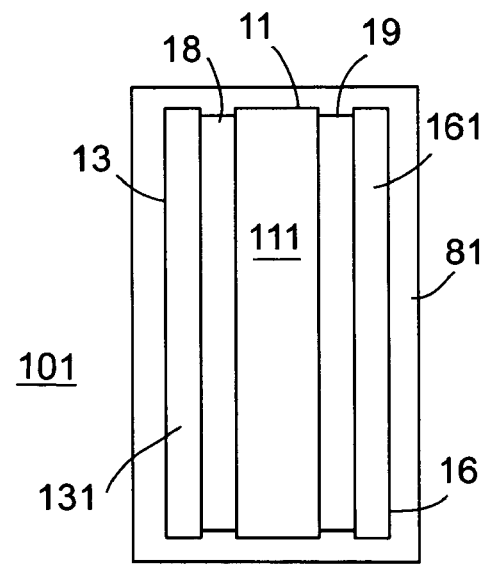
FIGS. 14-18 illustrate the semiconductor package structures of FIGS. 9-13 in further embodiments with protective layers.
Figure 15:
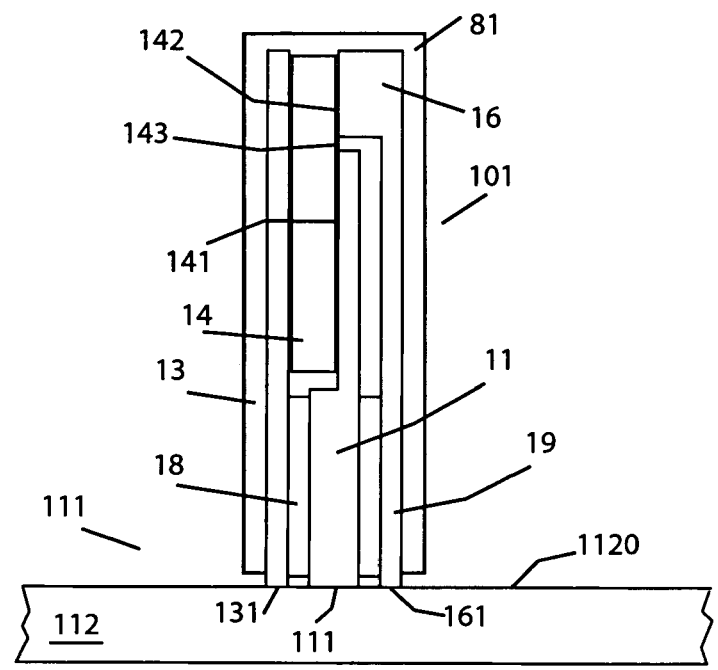

FIG. 14 is a bottom end view of package structure 100 of FIG. 9 with the addition of encapsulating layer 81 formed around portions of the structure to provide an encapsulated package structure 101. In this embodiment, encapsulating layer 81 does not cover mounting end surfaces 131, 111, or 161 so these surfaces can be attached to a next level of assembly. FIG. 15 is a side view of an assembly 151, which is similar to assembly 111 with the addition of encapsulating layer 81. In this embodiment, encapsulating layer 81 terminates as shown leaving surfaces 131, 111, and 161 exposed for attachment to printed circuit board 112.

Figure 16:
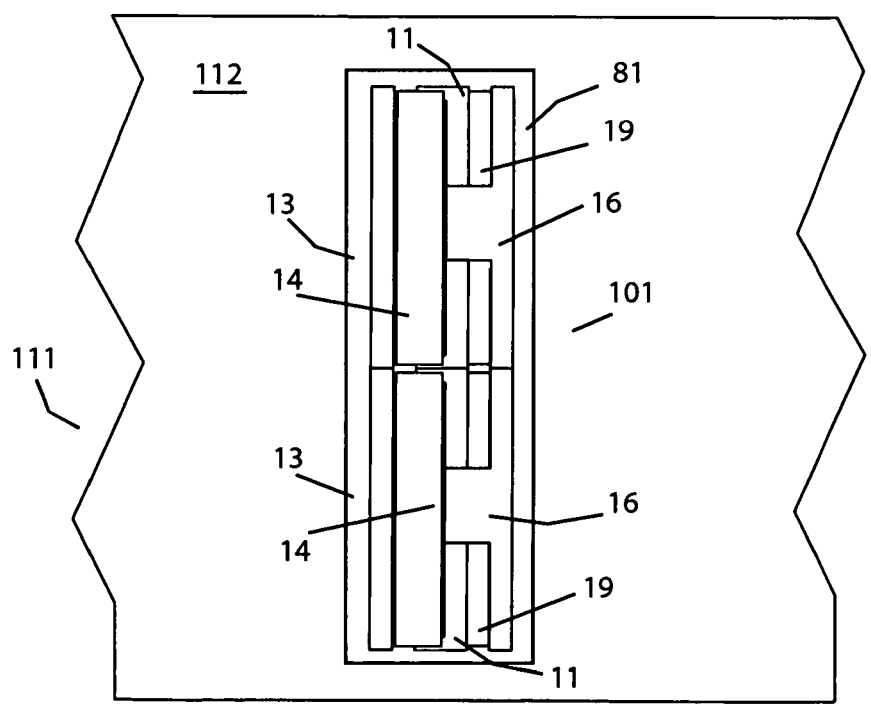
Figure 17:
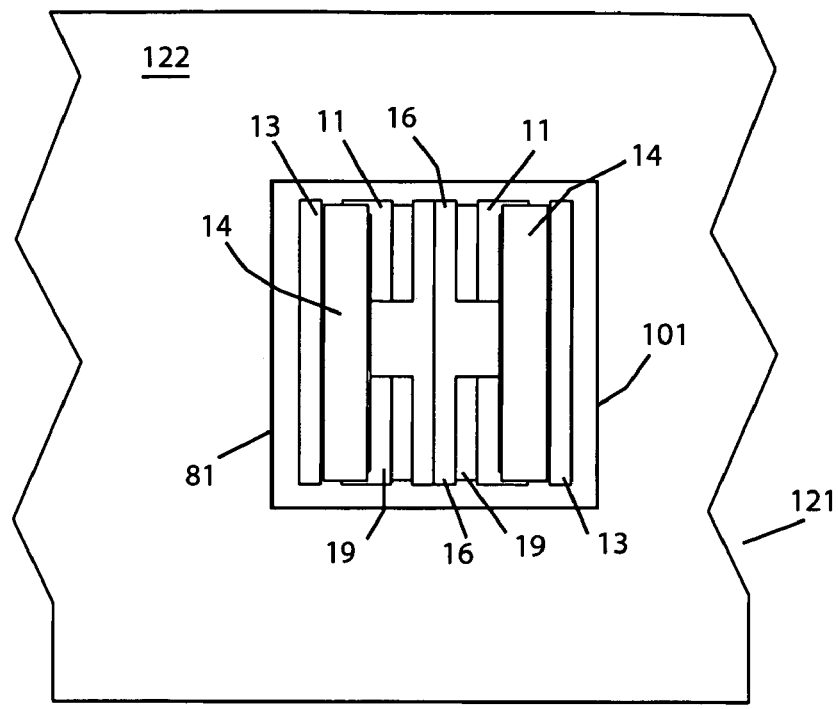
Figure 18:
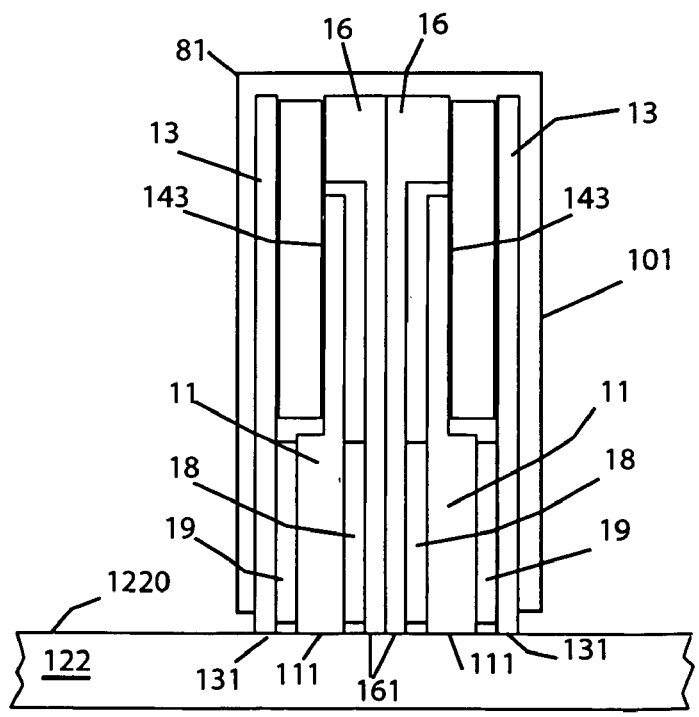

FIG. 16 is a top view of assembly 151 showing encapsulating layer 81 formed around a plurality of package structures in accordance with a side by side configuration 106. FIG. 17 is a top view of an assembly 171 showing encapsulating layer 81 formed around a plurality of package structures in accordance with a back to back configuration 107, and FIG. 18 is a side view of assembly 171 showing encapsulating terminating to leave surfaces 131, 111, and 161 exposed for attachment to printed circuit board 122. It is understood that encapsulating layer 81 may be added to the package structures of FIGS. 1 and 4-8 as well.

Thus, it is apparent that there has been provided, in accordance with the present invention, a structure and method for forming a semiconductor package for vertical mounting to a next level of assembly. The package incorporates a plurality of upright clips and spacers to provide a structure with enhanced thermal dissipation because the package promotes heat transfer to the ambient as opposed to heat transfer through a printed circuit board as occurs in prior art designs. Additionally, the present invention provides improved design flexibility by using spacers that are conductive and/or insulative as well as upright clips that may be coupled together for example, in side by side or back to back configurations. In addition, the package saves on horizontal space when attached to a next level of assembly.

Although the invention has been described and illustrated with reference to specific embodiments thereof, it is not intended that the invention be limited to these illustrative embodiments. For example, upright clips 13 in FIGS. 7, 12, 17 may be attached together in a back to back configuration. In addition, in the multiple package embodiments of the present invention, any upright clip in one package structure may be attached to any upright clip in another package for further design flexibility (e.g., upright clip 13 in one package structure to upright clips 13, 11, or 16 in another package structure, upright clip 11 in one package to upright clips 13, 11, or 16 in another package, upright clip 16 in one package to upright clip 13, 11, or 16 in another package structure).

What is claimed is:

1. A semiconductor package structure comprising:
   first and second clips each having an end configured for mounting the semiconductor package structure in a perpendicular orientation with respect to a next level of assembly;
   a semiconductor chip interposed between the first and second clips, the first clip coupled to one major surface of the semiconductor chip, and the second clip coupled to another major surface of the semiconductor chip;
   a third clip interposed between the first and second clips and coupled to one of the major surfaces of the semiconductor chip, wherein the third upright clip has an end configured for mounting the semiconductor package in a perpendicular orientation with respect to the next level of assembly;
   a first spacer interposed between the first and third clips; and
   a second spacer interposed between the second and third upright clips.

2. The structure of claim 1, wherein at least one of the first and second spacers is conductive.

3. The structure of claim 1, wherein the semiconductor chip comprises a power transistor, and wherein the first and second clips comprise current carrying electrodes and the third clip comprises a control electrode.

4. The structure of claim 1, wherein the third clip includes a struck-up portion for contacting the semiconductor chip.

5. The structure of claim 1, further comprising:
   fourth and fifth clips each having an end for mounting the semiconductor package structure in a perpendicular orientation with respect to the next level of assembly;
   a second semiconductor chip interposed between the fourth and fifth clips, the fourth clip coupled to one major surface of the second semiconductor chip, and the fifth clip coupled to another major surface of the second semiconductor chip;
   a sixth clip interposed between the fourth and fifth clips and coupled to one of the major surfaces of the second semiconductor chip;
   a third spacer interposed between the fourth and sixth clips; and
   a fourth spacer interposed between the fifth and sixth clips, wherein the fourth clip is coupled to first clip.

6. The structure of claim 5, wherein the fifth clip is coupled to the second clip.

7. The structure of claim 6, wherein the third clip is coupled to the sixth clip.

8. The structure of claim 5 further comprising an encapsulating layer formed around at least portions of the structure.

9. A power semiconductor package comprising:
   a power semiconductor chip having first and second opposing major surfaces;
   a first clip attached to the first major surface;
   a second clip attached to the second major surface;
   a third clip attached to the second major surface;
   a first spacer interposed between the first and second clips; and
   a second spacer interposed between the second and third clips, wherein each of the first, second, and third clips has an end portion for mounting to a next level of assembly so that the first and second major surfaces of the power semiconductor chip are perpendicular to the next level of assembly when attached thereto, and wherein at least one of the first and second spacers is insulative.

10. The package of claim 9 further comprising an encapsulating layer formed over portions of the package.

11. The package of claim 9, wherein another one of the first and second spacers is conductive.

12. The package of claim 9, wherein the power semiconductor chip comprises a MOSFET.

13. The package of claim 9 further comprising:
   a second power semiconductor chip having first and second opposing major surfaces;
   a fourth clip attached to the first major surface of the second power semiconductor chip;
   a fifth clip attached to the second major surface of the second power semiconductor chip;
   a sixth clip attached to the second major surface of the second power semiconductor chip;

a third spacer interposed between the forth and fifth clips; and a fourth spacer interposed between the fifth and sixth clips, wherein each of the fourth, fifth, and sixth clips has an end portion for mounting to the next level of assembly so that the first and second major surfaces of the second power semiconductor chip are perpendicular to the next level of assembly when attached thereto, and wherein one of the first, second and third clips is attached to one of the fourth, fifth, and sixth clips.

14. The package of claim 13 wherein the first and fourth clips are attached together, and wherein the second and fifth clips are attached together, and wherein the third and sixth clips are attached together.

15. A method for forming a semiconductor package comprising the steps of:

provoding a semiconductor chip having first and second opposing major surfaces;

attaching a first clip to the first major surface;

attaching a first spacer to the first clip;

attaching a second clip to the second major surface and the first spacer;

attaching a second spacer to the second clip, wherein at least one of the first and second spacers is insulative; and attaching a third clip to the second major surface and the second spacer, wherein each of the first, second, and third clips has an end portion for mounting to a next level assembly, and to orient the first and second major surfaces of the semiconductor chip perpendicular with respect to the next level of assembly.

16. The method of claim 15 further comprising the step of forming an encapsulating layer over portions of the package.

17. The method of claim 15, wherein the step of attaching the first spacer includes attaching a conductive spacer, and wherein the step of attaching the second spacer includes attaching an insulative spacer.

18. The method of claim 15, further comprising the steps of:

providing a second semiconductor chip having first and second opposing major surfaces;

attaching a fourth clip to the first major surface of the second semiconductor chip;

attaching a third spacer to the fourth clip;

attaching a fifth clip to the second major surface of the second semiconductor chip and the third spacer;

attaching a fourth spacer to the fifth clip;

attaching a sixth clip to the second major surface of the second semiconductor chip and the fourth spacer, wherein the each of the fourth, fifth, and sixth clips has an end portion for mounting to the next level assembly and to orient the first and second major surfaces of the second semiconductor chip perpendicular with respect to the next level of assembly; and attaching one of the first, second, and third clips to one of the fourth, fifth, and sixth clips.

* * * * *